United States Patent [19]

Chand

[11] Patent Number: 4,977,103
[45] Date of Patent: Dec. 11, 1990

[54] METHOD OF MAKING AN ARTICLE COMPRISING A III/V SEMICONDUCTOR DEVICE

[75] Inventor: Naresh Chand, Berkeley Heights, N.J.

[73] Assignee: AT&T Bell Laboratories, Murray Hill, N.J.

[21] Appl. No.: 398,115

[22] Filed: Aug. 24, 1989

[51] Int. Cl.$^5$ .......................................... H01L 21/203
[52] U.S. Cl. .......................... 437/105; 148/DIG. 24; 148/DIG. 97; 148/DIG. 169; 156/611; 437/107; 437/939
[58] Field of Search .................. 148/DIG. 2, 6, 7, 17, 148/24, 56, 65; 60, 97, 160, 169; 118/726, 727, 50; 156/610–614; 427/248.1, 255.1, 255.2; 437/81, 88, 105, 106, 107, 126, 133, 233, 925, 926, 936, 939, 946, 945, 949

[56] References Cited

U.S. PATENT DOCUMENTS

| | | | |
|---|---|---|---|
| 3,986,822 | 10/1976 | Lashway | 432/264 |
| 4,181,544 | 1/1980 | Cho | 437/107 |
| 4,426,237 | 1/1984 | Freeouf et al. | 156/612 |
| 4,426,237 | 1/1984 | Freeouf et al. | 437/107 |
| 4,732,648 | 3/1988 | Fronius et al. | 156/662 |
| 4,773,852 | 9/1988 | Tanji et al. | 432/265 |
| 4,913,652 | 4/1990 | Tanji et al. | 432/264 |

FOREIGN PATENT DOCUMENTS 59-06459 4/1984 Japan .

OTHER PUBLICATIONS

"Classification and Origins of GaAs Oval Defects Grown by Molecular Beam Epitaxy", by K. Fujiwara et al., *Journal of Crystal Growth*, λ(1987), pp. 104–112.
"Reduction of Gallium-Related Oval Defects", by D. G. Schlom et al., *Journal Vacuum Science Technology*, B7 (2), Mar./Apr. 1989, pp. 296–298.
"GaAs Substrate Preparation for Oval-Defect Elimination During MBE Growth", by H. Fronius et al., *Japanese Journal of Applied Physics*, vol. 25, Feb. 1986, pp. L137–138.
"Origin of Oval Defects in GaAs Layers Grown by Molecular Beam Epitaxy", by K. Akimoto et al., *Journal of Crystal Growth*, 73 (1985), pp. 117–122.
"Summary Abstract: The MBE Growth of GaAs Free of Oval Defects", by G. D. Pettit et al., Journal Vacuum Science Technology, B2(2), Apr./Jun. 1984, pp. 241–242.
"Source and Elimination of Oval Defects on GaAs Film Grown by Molecular Beam Epitaxy", by Y. G. Chai et al., *Applied Physics Letters*, 38(10), May 15, 1981, pp. 796–798.
"Oval Defects in $Ga_{1-x}Al_xAs$ Molecular Beam Epitaxy Layers: A Raman Scattering and Photoluminescence Combined Study", By J. Sapriel et al., Applied Physics Letters, 52(23), Jun. 6, 1988, pp. 1970–1972.
"Characterization of Oval Defects in Molecular Beam Epitaxy $Ga_{0.7}Al_{0.3}As$ Layers by Spatially Resolved (List continued on next page.)

*Primary Examiner*—Olik Chaudhuri
*Assistant Examiner*—William Bunch
*Attorney, Agent, or Firm*—Eugen E. Pacher

[57] ABSTRACT

The presence of oval defects on MBE-grown compound semiconductor (e.g., GaAs, InP, or InGaAs) epitaxial layers has proven to be a serious obstacle to the use of such material for the manufacture of integrated circuits (ICs), even though the use of such material potentially could result in ICs having superior performance. One particularly prevalent type of oval defect is generally referred to as α-type. It has now been discovered that compound semiconductor epitaxial layers that are essentially free of α-type oval defects can be grown by MBE if first at least a portion of the Ga and/or In metal crucible is coated with an appropriate second metal. The second metal is chosen from the group of metals that are wetted by the first metal and that are less electronegative than the first metal. Aluminum is a currently preferred second metal. Advantageously the interior of the (typically pBN) crucible is Al-coated at least at and near the orifice of the crucible, whereby formation of drops of first metal is prevented.

6 Claims, 1 Drawing Sheet

OTHER PUBLICATIONS

Cathodoluminescence", by A. C. Papadopoulo et al., *Applied Physics Letters,* 52(3), Jan. 18, 1988, pp. 224–226.

"Influence of Surface Defects on the Characteristics of High Electron Mobility Transistors Grown by Molecular-Beam Epitaxy", by T. Nakamura et al., *Journal Applied Physics,* 64(4), Aug. 15 1988, pp. 2164–2167.

"On the Origin of Oval Defect with Nucleus on Epilayers Grown by Molecular Beam Epitaxy", by Y. Nishikawa et al., *Japanese Journal of Applied Physics,* vol. 25, No., 6, Jun. 1986, pp. 908–909.

"$Ga_2O_3$: The Origin of Growth-Induced Oval Defects in GaAs Molecular Beam Epitaxy", by S. Weng, *Applied Physics Letters,* 49(6), Aug. 11, 1986.

"Particulates: A Direct Origin of Oval Defects in GaAs Layers Grown by Molecular Beam Epitaxy", by S. Weng et al., *Journal of Elecronic Materials,* vol. 15, No. 5, 1986, pp. 267–271.

Parker, *The Technology and Physics of Molecular Beam Epitaxy,* Plenum Press, New York, 1985, pp. 24–28.

METHOD OF MAKING AN ARTICLE COMPRISING A III/V SEMICONDUCTOR DEVICE

FIELD OF THE INVENTION

This invention pertains to methods of making a semiconductor device, and in particular, to methods of making a device formed in a compound semiconductor layer grown epitaxially on an appropriate semiconductor substrate.

BACKGROUND OF THE INVENTION

Most silicon integrated circuits are formed in a silicon layer that is epitaxially grown on a silicon substrate, since such epitaxial material can have much higher crystalline quality than bulk silicon. On the other hand, commercial gallium arsenide (GaAs) integrated circuits currently typically are made in bulk material, using metal-semiconductor field effect transistor (MESFET) technology, even though similar devices made in epitaxial GaAs, typically grown by molecular beam epitaxy (MBE), are superior in performance to those made in bulk material. An important reason for the current use of bulk GaAs for most commercial circuits is the frequent presence of so-called "oval defects" on MBE-grown GaAs.

Oval defects, so-called because of their appearance, generally are hillocks or (111) faceted growth around nucleation centers with major axis along <110>. Their typical size ranges from about 5 to 20 μm in length, and about 5 to 10 μm in width. Their areal density typically varies from about $10^2$ to about $10^5$ cm$^{-2}$, depending on the growth rate, epitaxial layer thickness, growth conditions and cleanliness of the substrate and the MBE system. Although not all types of oval defects necessarily degrade device performance, at least some of them, if present in the active region (e.g., the gate region of an FET) do degrade the performance of devices. The detrimental effect on device performance of oval defects can be expected to increase as device design rules become smaller. Thus, for MBE to be a production technique for producing epitaxial material for GaAs (and other III-V materials such as InP) high speed devices and large scale integrated circuits, oval defects must be eliminated.

The origin of oval defects in MBE-GaAs has been extensively studied in many laboratories. Fujiwara et al., *Journal of Crystal Growth*, Vol. 80, pg. 104, have classified oval defects as α and β types. The α-type defects lack microscopic core particulates, whereas β-type defects, which have microscopic core particulates, are due to particulates which land on the substrate either during preparation, loading, transferring, or growth. On a carefully prepared GaAs substrate, α-type oval defects, which are related to Ga "spitting" and/or the presence of $Ga_2O_3$, are the dominant oval defects.

Ga spitting is the result of condensation of Ga atoms at or near the relatively cool lip of the MBE Ga crucible. The condensing Ga atoms form drops which subsequently roll back into the molten Ga charge in the hotter bottom part of the crucible. This causes a violent boiling reaction, resulting in ejection of small Ga droplets from the crucible. Many of these droplets will land on the growth surface, resulting in formation of the oval defects. The presence of $Ga_2O_3$ in the Ga charge also can result in the formation of oval defects, due to the evaporation and subsequent landing of the oxides on the growth surface. The oxide can be present in the Ga crucible due to, inter alia, improper outgassing of the crucible, the presence of water vapors in the MBE system, or a leak in the system.

Both of the above mechanisms are continuous processes whose rate typically increases with increasing Ga crucible temperature. As a result, the density of oval defects typically increases with both growth rate and growth time.

A number of techniques have been reported that are said to avoid or reduce oval defects. However, such defects continue to remain a problem. For instance, D. G. Schlom et al., *Journal of Vacuum Science and Technology*, Vol. B7(2), pg. 296, remark that, ". . . while several groups have reported the elimination of oval defects, oval defects remain a problem."

Among the remedies proposed to eliminate the oval defect problem are the following: use of a sapphire crucible instead of the frequently used pyrolytic boron nitride (pBN) crucible (D. G. Schlom et al., op. cit.); a modified method of substrate cleaning (H. Fronius et al., *Japanese Journal of Applied Physics*, Vol. 25(2), pg. L137; see also U.S. Pat. No. 4,732,648); placing extra parts into the opening of the Ga crucible to inhibit condensed drops from rolling down to the Ga charge (Japanese patent JP 59-64-594); and re-designing the Ga cell to obtain a positive axial temperature gradient toward the cell orifice to prevent formation of Ga drops.

Other approaches have focused on the elimination of $Ga_2O_3$ from the melt. K. Akimoto et al., *Journal of Crystal Growth*, Vol. 73, pg. 117 have disclosed introduction of $H_2$ into an MBE system to reduce oxides; U.S. Pat. No. 4,426,237 and G. D. Pettit et al., *Journal of Vacuum Science and Technology*, Vol. B(2), pg. 241, disclose addition of aluminum and/or magnesium to the Ga melt for the same purpose; and Y. G. Chai et al., *Applied Physics Letters*, Vol. 38(10), pg. 796, disclose that recharging Ga in a clean crucible with fresh solid Ga, whenever the system is opened to the atmosphere, suppresses Ga oxidation.

With the above referred to Mg doping, complete elimination of oval defects was reported. However, the resulting GaAs layers were p-type doped to about $10^{19}$ cm$^{-3}$, and thus, for obvious reasons, the method is not generally useful. None of the other prior art methods can typically completely eliminate oval defects. Thus, in view of the technological importance of developing the ability to grow epitaxial GaAs (and other compound semiconductors such as InP) layers that are essentially free of oval defects, a technique for producing such essentially oval defect-free layers that is simple, reproducible, economical, and free of undesirable side effects such as unwanted doping would be highly desirable. This application discloses such a technique.

THE INVENTION

The invention is a method of making an article that comprises a semiconductor device. The device comprises a compound semiconductor material on a single crystal semiconductor substrate. The compound semiconductor material is III-V semiconductor material comprising at least a first metal selected from the group consisting of Ga and In, and at least one further element, exemplarily As or P.

The method comprises providing a semiconductor substrate having a major surface, exemplarily a (100)-oriented wafer of GaAs or InP, growing on the major surface the layer of III-V semiconductor material, forming the device in the layer, and carrying out one or more further steps towards completion of the article. The layer is grown by a technique that comprises evaporating a quantity of the first metal from a crucible that has an orifice and an interior surface, the crucible positioned such that at least a part of the evaporated first metal is deposited on the major surface, and that further comprises causing deposition of a quantity of the further element on the major surface.

Significantly, at least a part of the interior surface of the crucible, typically the portion near the orifice of the crucible, is coated with a second metal that is wetted by the first metal and that advantageously is less electronegative than the first metal. In a currently preferred embodiment the second metal is a metal that wets the crucible. Exemplarily, the second metal is Al. Using a thus coated crucible (e.g., a pBN crucible) can result in essentially complete elimination of oval defects due to spitting and/or the presence of first metal oxide in the charge. Wetting eliminates first metal drop formation, and use of a second metal of relatively low electronegativity typically decreases the amount of first metal oxide present in the crucible.

Typically the III-V layer is grown in a partial vacuum (e.g., pressure of less than about 1 mTorr) such that the evaporated first metal atoms form an atomic beam. This growth technique is generally known as MBE.

Figure 1:
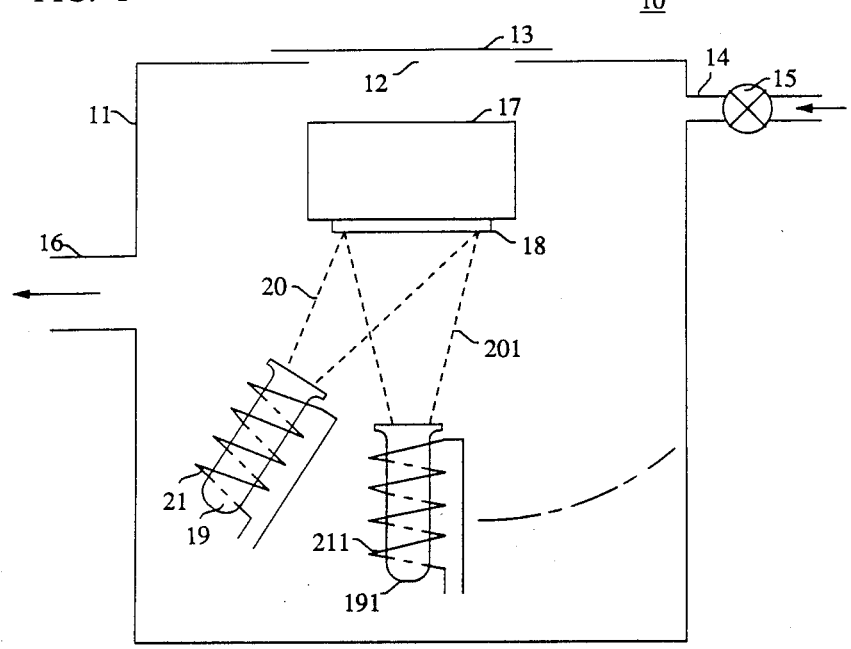
FIG. 1 schematically depicts an exemplary MBE system.

FIG. 1 schematically depicts an MBE system 10 that is suitable for the practice of the invention. Vacuum chamber 11 comprises access means 12 which can be closed by appropriate cover means 13, and further comprises tubing 14 for introducing gases into the chamber, together with a valve 15. The chamber is connected, through pump port 16, to an appropriate vacuum pump or pumps, not shown. Within the chamber is substrate heater block 17 whose temperature can be varied by means not shown, as well as, typically, a multiplicity of effusion cells 19, 191, . . . . For each effusion cell is provided means (21, 211, . . . ) for heating the cell, exemplarily resistance heaters. Heating the cells to an appropriate temperature causes evaporation of material (e.g., Ga) contained in the cell such that a molecular beam (20, 201, . . . ) impinges on wafer 18, which is attached to the heater block by conventional means that are not shown. MBE systems typically comprise a variety of other means, e.g., pressure gauges, temperature measuring means, flux measuring means, surface characterization means and shutters that are conventional and well known to those skilled in the art and that therefore are not shown.

Figure 2:
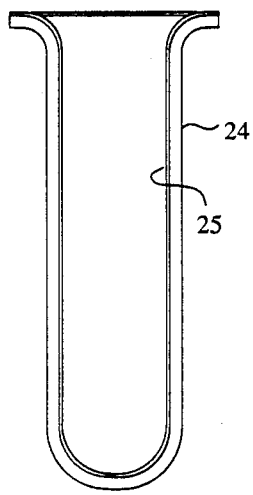
FIG. 2 shows schematically an exemplary crucible that can advantageously be used in the practice of the invention.

FIG. 2 shows schematically a crucible according to the invention. The crucible preferably is made of pyrolytic boron nitride 24, with the inside of the crucible covered (completely or in part) with a thin coating 25 of second metal, exemplarily Al. The thickness of the coating is not crucial, provided it is sufficient to result in a substantially continuous coating at and near the orifice of the crucible such that the first metal is prevented from forming drops at and near the orifice.

The second metal coating can be applied to the interior surface of the crucible by any appropriate technique. For instance, the crucible, after appropriate outgassing, can be charged with a quantity of the second metal and be heated in a partial vacuum to a temperature above the melting point of the second metal, such that the resulting second metal vapor coats the interior surface of the crucible. Advantageously the crucible is heated to a temperature higher than the temperature at which the first metal is to be evaporated. Exemplarily, if the second metal is Al then the crucible can be heated to a temperature in the range 1150°–1250° C.

An appropriately coated crucible can be charged with a quantity of first metal and the III-V layer formed in conventional manner. For instance, in an exemplary MBE system the distance between the first metal crucible and substrate is 120 mm. If the first metal is Ga (and the additional element is As), then heating the crucible to 900°–950° C. can result in about 1 $\mu$m/hr growth rate of GaAs. If the source/substrate distance is larger then the crucible temperature has to be higher in order to result in the same growth rate.

In order to keep the total defect density of the III-V layer as low as possible, great care has to be exercised, and the system has to be kept rigorously clean. By using appropriate procedures it has been possible to grow, by prior art techniques, GaAs that had a background carrier density as low as $10^{13}$ cm$^{-3}$. When lightly doped (n~$3\times10^{13}$ cm$^{-3}$), the material exhibited at 42K an electron mobility of $3\times10^5$ cm$^2$V$^{-1}$s$^{-1}$, the highest ever measured in MBE GaAs. However, even though the prior art growth technique can produce material of exceptional quality, it typically resulted in an oval defect density in the range $10^3$–$10^5$ cm$^2$, depending on the layer thickness and the growth conditions. For instance, the density on a 4 $\mu$m thick layer was $3.6\times10^4$ cm$^{-2}$, and on a 15 $\mu$m thick layer $3\times10^5$ cm$^{-2}$.

No correlation was found between the oval defect density and the types of substrate and cleaning procedures used. Similar densities were observed on material grown on GaAs and Si substrates which were prepared differently. On the other hand, use of an Al-coated crucible according to the invention reduced the density of $\alpha$-type oval defects essentially to zero, with only remaining defects being of $\beta$-type, as well as some non-oval defects. These defects are related to surface contamination and can be essentially completely eliminated through very careful surface preparation.

GaAs grown according to the inventive method contained a minor amount of Al. Exemplarily, the material contained 0.0016 parts Al and 0.9984 parts Ga. The electrical performance was not degraded by the presence of Al.

It has been verified that the mere presence of Al in the first metal melt does not suffice to eliminate $\alpha$-type oval defects. For instance, use of a prior art (uncoated) pBN crucible to whose Ga charge had been added 0.5% b.w. of Al resulted in a 5 $\mu$m thick GaAs having about 4000 cm$^{-2}$ $\alpha$-type oval defects.

EXAMPLE 1

A crucible was coated as follows. Into a previously used (for evaporation of Al-doped Ga) empty pBN crucible was placed about 1 g of Al, and the crucible heated in a commercially available MBE system (Riber 32P) to about 1200° C. until the beam equivalent pressure of Al dropped two orders of magnitude, indicating that the crucible was almost empty. After cool-down the system was opened. The interior of the crucible was lightly Al-coated.

The crucible was loaded with a fresh ingot of Ga. A 7.5 cm diameter (100)-oriented GaAs wafer was prepared by a conventional technique and loaded into the MBE system. The distance between the wafer and the mouth of the Ga source was 150 mm. After closing the MBE chamber was evacuated to about $10^{-10}$ Torr, and the shutters, cells and filaments were thoroughly outgassed. Then the cell temperatures were adjusted to result in a GaAs growth rate of 1 μm/hr (Ga crucible temperature about 1010° C.), the shutters were opened, and the wafer exposed to a flux of Ga and As for 5 hours. After completion of the layer growth and cooldown the wafer was withdrawn and inspected. The density of α-type oval defects was essentially zero, and that of β-type defects was about 100 cm$^{-2}$. Photoluminescence spectra of the epitaxial GaAs layer indicated the presence of about 0.16 atomic percent of Al.

EXAMPLE 2

An epitaxial layer of InGaAs is grown on an InP wafer by a technique substantially as described in Example 1, except that the In crucible temperature is about 900° C. The resulting layer is essentially free of α-type oval defects.

I claim:

1. Method of making an article comprising a semiconductor device comprising a compound semiconductor material on a single crystal semiconductor substrate, the compound semiconductor material comprising at least one first metal selected from the group consisting of Ga and In, and further comprising at least one further element, the method comprising
    (a) providing the semiconductor substrate, the substrate having a major surface;
    (b) growing on the major surface a layer of the compound semiconductor material by a technique that comprises
    (i) evaporating a quantity of the first metal from a crucible having an orifice and an interior surface, the crucible comprising material that is not wetted by the first metal, the crucible positioned such that at least a part of the evaporated first metal is deposited on the major surface; and
    (ii) causing deposition of a quantity of the further element on the major surface; and
    (c) carrying out one or more further steps towards completion of the article;
    characterized in that at least a part of the interior surface of the crucible is coated with a second metal that is wetted by the first metal and that is less electronegative than the first metal.

2. Method of claim 1, wherein the at least one further element is selected from the group consisting of As and P, and wherein the second metal is Al.

3. Method of claim 2, wherein the semiconductor substrate is a GaAs substrate or a Si substrate, and wherein the at least one first metal and the at least one further element are Ga and As, respectively.

4. Method of claim 2, wherein the semiconductor substrate is a InP substrate, wherein the at least one first metal and the at least one further element are In and As, respectively.

5. Method of claim 1, wherein (c) comprises forming the device in the layer of compound semiconductor material.

6. Method of claim 1, wherein the crucible is a boron nitride crucible, and wherein the part of the interior surface at and near the orifice of the crucible is coated with Al.

* * * * *